United States Patent
Wang et al.

(10) Patent No.: US 9,912,146 B1
(45) Date of Patent: Mar. 6, 2018

(54) METHOD AND DEVICE FOR SUPRESSING COMMON-MODE VOLTAGE OF INVERTER ALTERNATING CURRENT CABLE RELATIVE TO GROUND

(71) Applicant: SUNGROW POWER SUPPLY CO., LTD., Hefei, Anhui (CN)

(72) Inventors: Changyou Wang, Anhui (CN); Wei Sun, Anhui (CN); Qun Zheng, Anhui (CN)

(*) Notice: Subject to any disclaimer, the term of this patent is extended or adjusted under 35 U.S.C. 154(b) by 0 days.

(21) Appl. No.: 15/608,500

(22) Filed: May 30, 2017

(30) Foreign Application Priority Data

Nov. 28, 2016 (CN) .......................... 2016 1 1064259

(51) Int. Cl.
| | |
|---|---|
| H02J 1/02 | (2006.01) |
| H02M 1/12 | (2006.01) |
| H02M 1/14 | (2006.01) |
| H02M 7/521 | (2006.01) |
| H02H 7/122 | (2006.01) |
| H02M 7/48 | (2007.01) |
| H01L 39/14 | (2006.01) |
| H02M 3/07 | (2006.01) |
| H02M 7/5383 | (2007.01) |
| H02M 1/00 | (2006.01) |

(52) U.S. Cl.
CPC .............. *H02H 7/122* (2013.01); *H01L 39/14* (2013.01); *H02M 1/12* (2013.01); *H02M 3/07* (2013.01); *H02M 7/48* (2013.01); *H02M 7/5383* (2013.01); *H02M 2001/007* (2013.01); *H02M 2001/123* (2013.01)

(58) Field of Classification Search
CPC .......................... H02M 1/12; H02M 2001/123
USPC ........... 323/223; 363/34, 39–43, 95, 97, 137
See application file for complete search history.

(56) References Cited

U.S. PATENT DOCUMENTS 5,719,757 A * 2/1998 Beyerlein ........... H02M 1/4216
  323/211
5,999,423 A * 12/1999 Steinke .................... H02M 7/48
  363/40

(Continued)

FOREIGN PATENT DOCUMENTS

EP 2387137 A1 11/2011
JP 2011135684 A 7/2011

OTHER PUBLICATIONS

Extended European Search Report corresponding to Application No. 171732910.0-1809; dated Dec. 15, 2017.

*Primary Examiner* — Gary Nash

(57) ABSTRACT

A method and a device for suppressing a common-mode voltage of an inverter AC cable relative to ground are provided. A control unit generates a control signal according to a voltage of the AC side of the inverter. A switch unit connects or disconnects the discharge unit with ground or reference ground in response to the control signal. A discharge unit discharges the common-mode voltage of the inverter AC cable relative to ground when the switch unit is turned on. Therefore, during maintenance of the inverter when the AC switch is turned off, the common-mode voltage of the AC cable relative to ground can be discharged without using the isolated sampling solution in the conventional technology which has a high implementation cost and has a high requirement on the insulation class of the components, thereby avoiding the risk of electric shock to the maintenance technician.

10 Claims, 5 Drawing Sheets

(56) References Cited

U.S. PATENT DOCUMENTS

| | | | |
|---|---|---|---|
| 8,279,639 B2 * | 10/2012 | Sakakibara | H02M 5/4585 |
| | | | 318/722 |
| 2010/0182100 A1 | 7/2010 | Tucker | |
| 2011/0292695 A1 | 12/2011 | Skibinski et al. | |
| 2012/0068655 A1 * | 3/2012 | Inuduka | H02M 1/126 |
| | | | 318/494 |
| 2012/0187894 A1 * | 7/2012 | Higuchi | H02M 1/126 |
| | | | 318/811 |
| 2014/0043880 A1 * | 2/2014 | Nuss | H02H 3/33 |
| | | | 363/95 |

* cited by examiner

METHOD AND DEVICE FOR SUPRESSING COMMON-MODE VOLTAGE OF INVERTER ALTERNATING CURRENT CABLE RELATIVE TO GROUND

CROSS REFERENCE TO RELATED APPLICATION

The present application claims the priority under 35 U.S.C. § 119 to Chinese Patent Application No. 201611064259.8, titled "METHOD AND DEVICE FOR SUPRESSING COMMON-MODE VOLTAGE OF INVERTER ALTERNATING CURRENT CABLE RELATIVE TO GROUND", filed on Nov. 28, 2016 with the State Intellectual Property Office of the People's Republic of China, which is incorporated herein by reference in its entirety.

FIELD

The disclosure relates to the technical field of inverter common-mode voltage suppression, and particularly to a method and a device for suppressing a common-mode voltage of an inverter alternating current cable relative to ground.

BACKGROUND

In order to satisfy safety standards and the Electro Magnetic Compatibility (EMC) requirements, safety capacitors are connected between direct current (DC) input terminals as well as alternating current (AC) output terminals of a grid-connected inverter and ground at one or more positions. FIG. 1 is a schematic diagram of equivalent insulation resistors relative to ground and equivalent safety capacitors relative to ground at the DC side as well as the AC side of the grid-connected inverter, where R+ represents an equivalent insulation resistor of a positive DC input terminal relative to ground, R− represents an equivalent insulation resistor of a negative DC input terminal relative to ground, Y+ represents an equivalent Y capacitor of the positive DC input terminal relative to ground, Y− represents an equivalent Y capacitor of the negative DC input terminal relative to ground, and Y1, Y2, Y3 and YN respectively represent equivalent Y capacitors of three-phase live lines U, V, and W and an N line relative to ground.

A DC side and an AC side of an existing grid-connected inverter generally adopt a non-isolated sampling solution, and such non-isolated sampling solution may cause a common-mode loop (as indicated by the dotted lines in FIG. 1) to be formed by a DC side non-isolated sampling network, an AC side non-isolated sampling network and their respective safety capacitors relative to ground. In this case, during maintenance of the grid-connected inverter, although an AC switch for connecting the inverter with the power grid is turned off, the maintenance technician is still exposed to a risk of electric shock since the equivalent Y capacitor relative to ground at the AC side is charged through the common-mode loop, and a significant great common-mode voltage is generated between an AC output cable of the inverter and ground. In addition, most of conventional technologies focus on suppression of a high-frequency common-mode voltage in the voltage in grid-connected state. However, during maintenance of the inverter when the AC switch is turned off, a significant common-mode DC voltage on the AC cable generated due to the existence of the common-mode loop still causes an electric shock risk to the maintenance technician.

Further, in consideration that reference grounds PEs of the DC side as well as the AC side of the inverter are metal housing of cases, and equivalent Y capacitors relative to ground are distributed in different positions, it is difficult to cut off the common-mode loop by directly connecting switches in series. In the conventional technology, there are some solutions where the common-mode loop is cut off using the DC side isolated sampling network and the AC side isolated sampling network, thereby eliminating the common-mode voltage of the AC cable relative to ground, as shown in FIG. 2. However, a system adopting such a solution has a high implementation cost, and has a high requirement on the insulation class of the components of the isolated sampling network.

SUMMARY

A method and a device for suppressing a common-mode voltage of an inverter AC cable relative to ground are provided according to the present disclosure, in order to solve the technical issue in the conventional technology that, when an inverter is maintained while being disconnected from the power grid, a high-cost solution needs to be adopted to avoid the electric shock to a human body due to the common-mode voltage of the AC cable relative to the ground.

In order to achieve the above object, the following technical solutions are provided according to the present disclosure.

It is provided a device for suppressing a common-mode voltage of an inverter AC cable relative to ground, which includes a control unit, a switch unit and a discharge unit. An output terminal of the control unit is connected with an input terminal of the switch unit, the control unit is configured to generate a control signal according to a voltage of an AC side of an inverter. A terminal of the switch unit is connected with an output terminal of the discharge unit and an N line at the AC side of the inverter, the other terminal of the switch unit is connected with ground or reference ground, the switch unit is configured to be turned off or turned on in response to the control signal. Input terminals of the discharge unit is connected with three-phase live lines at the AC side of the inverter, the discharge unit is configured to discharge the common-mode voltage of the inverter AC cable relative to ground when the switch unit is turned on.

Preferably, an input terminal of the control unit may be connected with an AC side non-isolated sampling network at the AC side of the inverter, and the control unit may be configured to determine whether the AC side of the inverter is connected with a power grid according to the voltage of the AC side of the inverter, generate a control signal for controlling the switch unit to be turned off in a case that the AC side of the inverter is connected with the power grid, and generate a control signal for controlling the switch unit to be turned on in a case that the AC side of the inverter is disconnected with the power grid.

Preferably, the switch unit may include a normally closed relay. Input terminals of the control unit may be connected with the three-phase live lines at the AC side of the inverter; and the control unit may be configured to generate, according to the voltage of the AC side of the inverter, a power-supply voltage of the normally closed relay as a control signal for controlling the normally closed relay to be opened in a case that the AC side of the inverter is connected with a power grid, and generate, according to the voltage of the AC side of the inverter, a voltage lower than the power-supply voltage as a control signal for controlling the normally closed relay to be closed in a case that the AC side of the inverter is disconnected with the power grid.

Preferably, the switch unit may include a normally closed AC relay, and the control unit may include an AC power supply circuit; or the switch unit may include a normally closed DC relay, and the control unit may include an AC rectification circuit and a DC power supply circuit, input terminals the AC rectification circuit serving as the input terminals of the control unit, an output terminal of the AC rectification circuit being connected with an input terminal of the DC power supply circuit, and an output terminal of the DC power supply circuit serving as the output terminal of the control unit.

Preferably, the discharge unit may include: resisters respectively connected between the three-phase live lines at the AC side of the inverter and the input terminal of the switch unit; inductors respectively connected between the three-phase live lines at the AC side of the inverter and the input terminal of the switch unit; or passive component sets respectively connected between the three-phase live lines at the AC side of the inverter and the input terminal of the switch unit.

Preferably, the switch unit may include at least one controlled on-off component including a switch, a relay, or a semi-conductive switch element.

Preferably, the switch unit may further include a resister, one terminal of the resistor serves as the input terminal of the switch unit, and the other terminal of the resistor is connected with the switch, the relay or the semi-conductive element.

It is provided a method for suppressing a common-mode voltage of an inverter AC cable relative to ground, applied to a device for suppressing a common-mode voltage of an inverter AC cable relative to ground including a control unit, a switch unit and a discharge unit, the method for suppressing a common-mode voltage of an inverter AC cable relative to ground including: generating, by the control unit, a control signal according to a voltage of an AC side of an inverter; connecting or disconnecting, by the switch unit, the discharge unit with ground or reference ground in response to the control signal; and discharging, by the discharge unit, the common-mode voltage of the inverter AC cable relative to ground when the switch unit is turned on.

Preferably, the generating, by the control unit, the control signal according to the voltage of the AC side of the inverter may include: determining, by the control unit according to the voltage of the AC side of the inverter, whether the AC side of the inverter is connected with a power grid; generating, by the control unit, a control signal for controlling the switch unit to be turned off in a case that the AC side of the inverter is connected with the power grid; and generating, by the control unit, a control signal for controlling the switch unit to be turned on in a case that the AC side of the inverter is disconnected with the power grid.

Preferably, the switch unit may include a normally closed relay; and the generating, by the control unit, the control signal according to the voltage of the AC side of the inverter may include: generating, by the control unit according to the voltage of the AC side of the inverter, a power-supply voltage of the normally closed relay as a control signal for controlling the normally closed relay to be opened in a case that the AC side of the inverter is connected with a power grid; and generating, by the control unit according to the voltage of the AC side of the inverter, a voltage lower than the power-supply voltage as a control signal for controlling the normally closed relay to be closed in a case that the AC side of the inverter is disconnected with the power grid.

With the device for suppressing a common-mode voltage of an inverter AC cable relative to ground according to the present disclosure, the control unit generates a control signal according to a voltage of the AC side of the inverter, the switch unit connects or disconnects the discharge unit with ground or reference ground in response to the control signal, and the discharge unit discharges the common-mode voltage of the inverter AC cable relative to ground when the switch unit is turned on. Therefore, during maintenance of the inverter when the AC switch is turned off, the common-mode voltage of the AC cable relative to ground can be discharged without using the isolated sampling solution in the conventional technology which has a high implementation cost and has a high requirement on the insulation class of the components, thereby avoiding the risk of electric shock to the maintenance technician.

BRIEF DESCRIPTION OF THE DRAWINGS

The drawings to be used in the description of the embodiments or the conventional technology will be described briefly as follows, so that the technical solutions according to the embodiments of the present disclosure or according to the conventional technology will become clearer. It is apparent that the drawings in the following description only illustrate some embodiments of the present disclosure. For those skilled in the art, other drawings may be obtained according to these drawings without any creative work.

DETAILED DESCRIPTION OF THE EMBODIMENTS

To make the above object, features and advantages of the present disclosure more apparent and easier to be understood, particular embodiments of the disclosure are illustrated in detail in conjunction with the drawings hereinafter.

A device for suppressing a common-mode voltage of an inverter AC cable relative to ground is provided according to the present disclosure, in order to solve the technical issue in the conventional technology that, during maintenance of an inverter when the inverter is disconnected from the power grid, a high-cost solution needs to be adopted to avoid the electric shock to a human body due to the common-mode voltage of the AC cable relative to the ground.

Figure 1:
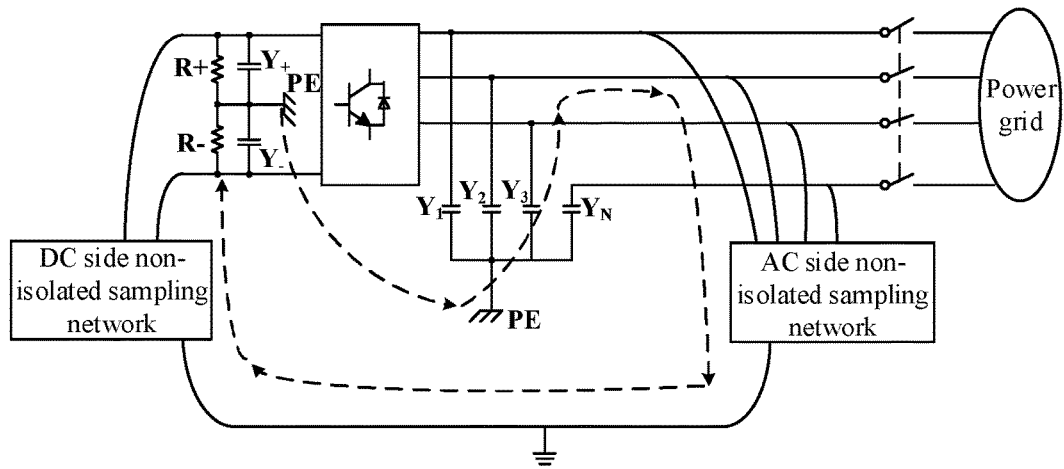
FIG. 1 is a block diagram of a common-mode loop of an inverter system adopting a non-isolated sampling solution in the conventional technology.
Figure 2:
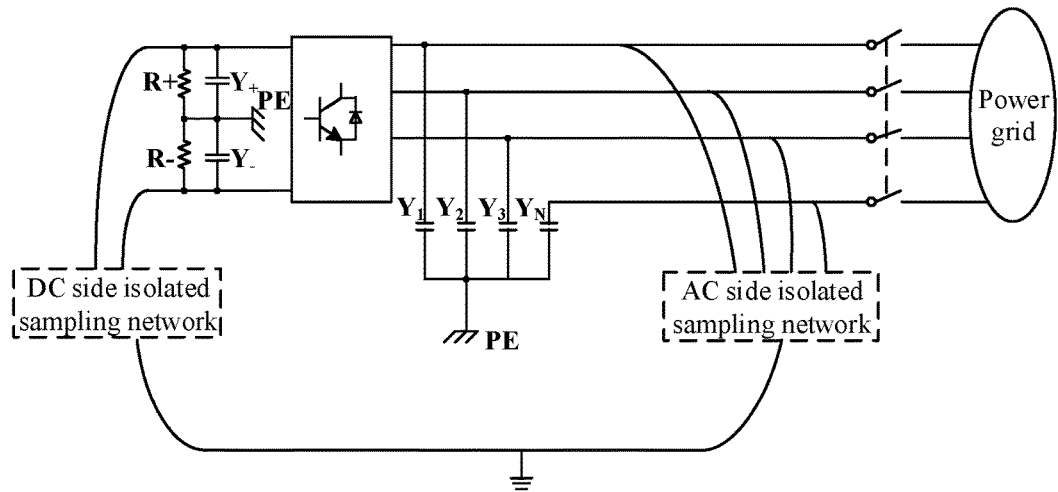
FIG. 2 is a schematic structural diagram of an inverter system adopting an isolated sampling solution in the conventional technology.
Figure 3:
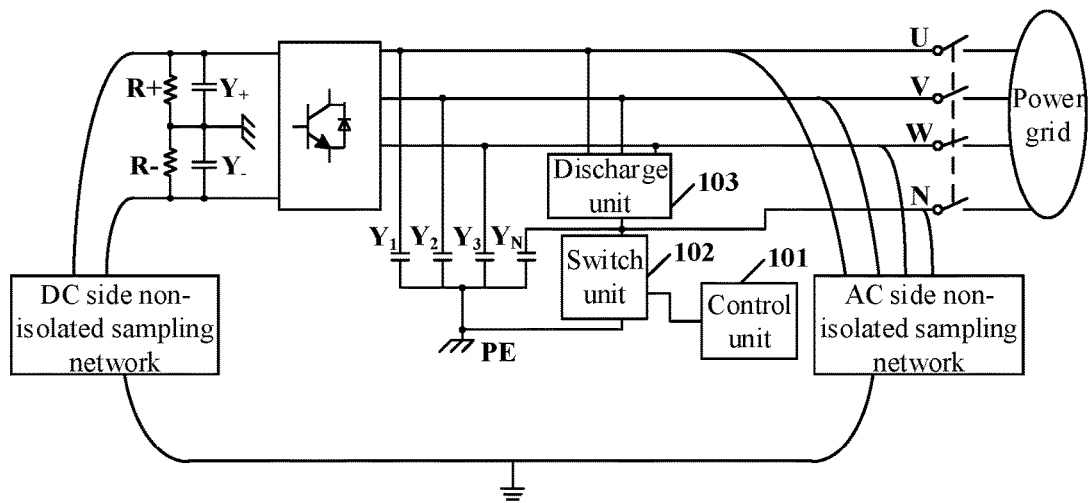
FIG. 3 is a schematic structural diagram of a device for suppressing a common-mode voltage of an inverter AC cable relative to ground according to an embodiment of the present disclosure.

As shown in FIG. 3, the device for suppressing a common-mode voltage of an inverter AC cable relative to ground includes a control unit 101, a switch unit 102 and a discharge unit 103.

An output terminal of the control unit 101 is connected with an input terminal of the switch unit 102.

A terminal of the switch unit 102 is connected with an output terminal of the discharge unit 103 and an N line at an AC side of an inverter, and the other terminal of the switch unit 102 is connected with ground or reference ground.

Input terminals of the discharge unit 103 are connected with three-phase live lines (U, V, W) at the AC side of the inverter.

R+ represents an equivalent insulation resistor of a positive DC input terminal relative to ground, R− represents an equivalent insulation resistor of a negative DC input terminal relative to ground, Y+ represents an equivalent Y capacitor of the positive DC input terminal relative to ground, and Y− represents an equivalent Y capacitor of the negative DC input terminal relative to ground. Y1, Y2, Y3 and YN respectively represent equivalent Y capacitors of three-phase live lines U, V, and W and an N line relative to ground.

In the following, the operation principle is described.

By connecting the discharge unit 103 to the three-phase power grid at the AC side of the inverter, a neutral point of the three-phase power grid is constructed. The neutral point is connected to ground or the reference ground PE (the case) via the controlled switch unit 102.

The control unit 101 generates a control signal according to a voltage of the AC side of the inverter. The switch unit 102 is turned on or turned off in response to the control signal. The discharge unit 103 discharges the common-mode voltage of the inverter AC cable relative to ground when the switch unit 102 is turned on.

With the isolated sampling solution in the conventional technology, although the electric shock can be avoided during the maintenance of the inverter when the AC switch is turned off, the implementation cost is high. With the device for suppressing a common-mode voltage of an inverter AC cable relative to ground according to this embodiment, the N line at the AC side of the inverter (which may be an actual N line at the AC side or a virtual N line at the AC side) is connected to the case or connected to ground via the controlled switch unit 102. The common-mode voltage of the AC cable relative to ground can be discharged without changing the existing non-isolated sampling network. The implementation cost is low, and the electric shock risk can be avoided effectively.

Figure 4:
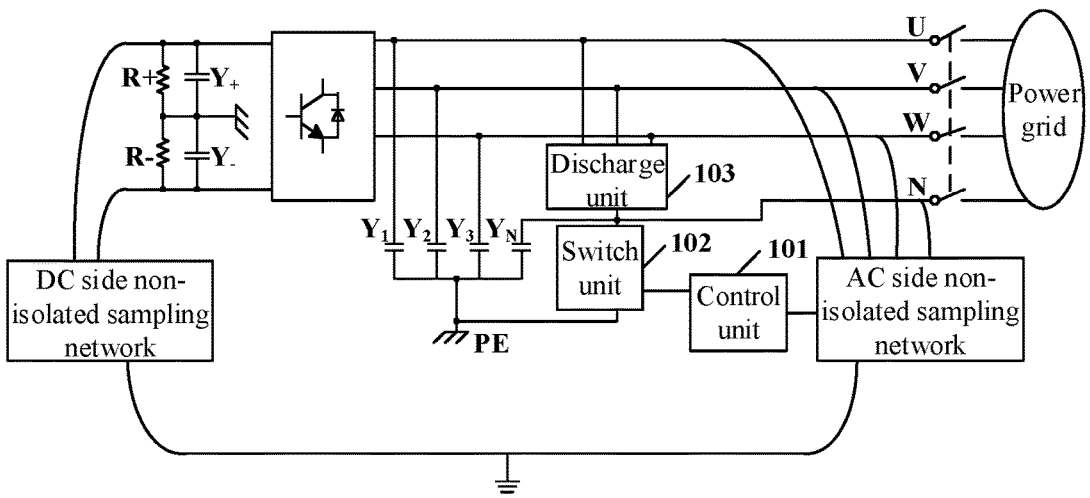
FIG. 4 is a schematic structural diagram of a device for suppressing a common-mode voltage of an inverter AC cable relative to ground according to another embodiment of the present disclosure.

A device for suppressing a common-mode voltage of an inverter AC cable relative to ground is provided according to another embodiment of the present disclosure. Referring to FIG. 4, on the basis of the device according to the above embodiment and illustrated in FIG. 3, an input terminal of the control unit 101 is connected with an AC side non-isolated sampling network at the AC side of the inverter.

In this case, the control unit 101 is configured to determine whether the AC side of the inverter is connected with a power grid according to the voltage of the AC side of the inverter, generate a control signal for controlling the switch unit 102 to be turned off in a case that the AC side of the inverter is connected with the power grid, and generate a control signal for controlling the switch unit 102 to be turned on in a case that the AC side of the inverter is disconnected with the power grid.

Specifically, the control unit 101 in this embodiment is responsible for signal processing and logic control, thereby performing the on-off control of the switch unit 102. When the inverter is connected with the power grid, the switch unit 102 is turned off, and when the inverter is disconnected with the power grid, the switch unit 102 is turned on, such that the discharge unit 103 is connected to ground. At this moment, the discharge unit 103 is connected in parallel with the equivalent Y capacitor relative to ground of the AC side, thereby discharging the common-mode DC voltage on the equivalent Y capacitor relative to ground, to reduce the common-mode DC voltage on the equivalent Y capacitor to be below a safety voltage, so as to avoid the electric shock risk.

Figure 5:
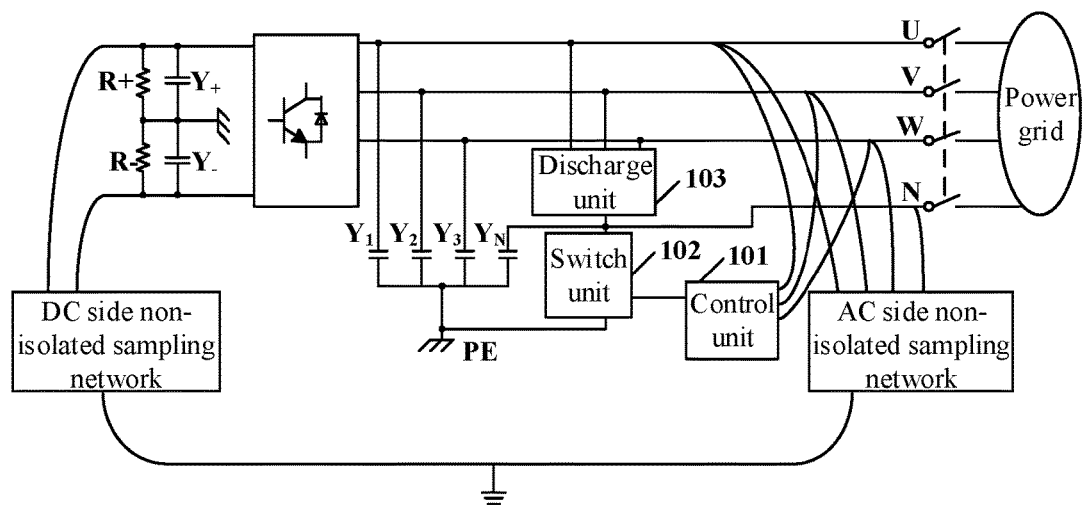
FIG. 5 is a schematic structural diagram of a device for suppressing a common-mode voltage of an inverter AC cable relative to ground according to another embodiment of the present disclosure.

Alternatively, a device for suppressing a common-mode voltage of an inverter AC cable relative to ground is provided according to another embodiment of the present disclosure. Referring to FIG. 5, on the basis of the device according to the above embodiment and illustrated in FIG. 3, the switch unit 102 includes a normally closed relay, and input terminals of the control unit 101 are connected with the three-phase live lines at the AC side of the inverter.

In this case, the control unit 101 is configured to generate, according to the voltage of the AC side of the inverter, a power-supply voltage of the normally closed relay as a control signal for controlling the normally closed relay to be opened in a case that the AC side of the inverter is connected with a power grid, and generate, according to the voltage of the AC side of the inverter, a voltage lower than the power-supply voltage as a control signal for controlling the normally closed relay to be closed in a case that the AC side of the inverter is disconnected with the power grid.

Preferably, the switch unit 102 includes a normally closed AC relay, and the control unit 101 includes an AC power supply circuit.

Alternatively, the switch unit 102 includes a normally closed DC relay, and the control unit 101 includes an AC rectification circuit and a DC power supply circuit. Input terminals the AC rectification circuit serves as the input terminals of the control unit 101, an output terminal of the AC rectification circuit is connected with an input terminal of the DC power supply circuit, and an output terminal of the DC power supply circuit serves as the output terminal of the control unit 101.

The device for suppressing a common-mode voltage of an inverter AC cable relative to ground according to this embodiment differs from the device illustrated in FIG. 4 in that, the controlled switch unit 102 adopts an AC relay or a DC relay with normally closed contacts, and the switch unit 102 is directly controlled by an AC power supply or a power supply acquired by rectifying the AC power supply.

Specifically, in a case that the switch unit 102 includes the normally closed AC relay, the control unit 101 may control the power supply to the switch unit 102 using directly the AC power grid. In a case that the switch unit 102 includes the normally closed DC relay, the control unit 101 may supply power to the switch unit 102 using a power supply obtained by rectifies the AC power supply. In this case, when the inverter operates in a grid-connection state, the normally closed relay is switched to a normally open state under control of a voltage from the power grid, and when the inverter is disconnected from the power grid, the normally closed relay returns to the normally closed state, thereby discharging the common-mode voltage on the equivalent Y capacitor relative to ground at the AC side.

A device for suppressing a common-mode voltage of an inverter AC cable relative to ground is provided according to another embodiment of the present disclosure, on the basis of the devices according to the above embodiments and illustrated in FIGS. 3, 4 and 5.

Figure 6:
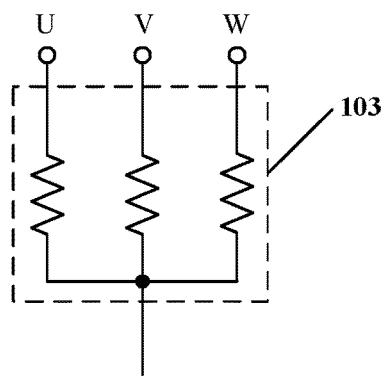
FIG. 6 is a schematic structural diagram of a discharge unit according to an embodiment of the present disclosure.

The discharge unit 103 includes resisters respectively connected between the three-phase live lines U, V, and W at the AC side of the inverter and the input terminal of the switch unit 102, as shown in FIG. 6.

Figure 7:
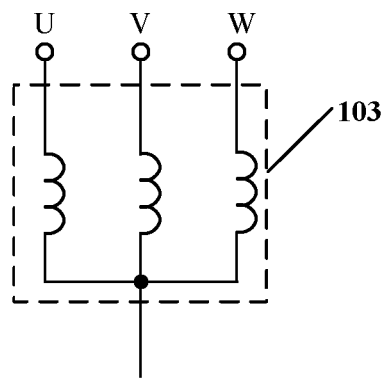
FIG. 7 is a schematic structural diagram of a discharge unit according to another embodiment of the present disclosure.

Alternatively, the discharge unit 103 includes inductors respectively connected between the three-phase live lines U, V, and W at the AC side of the inverter and the input terminal of the switch unit 102, as shown in FIG. 7.

Alternative, the discharge unit 103 includes passive component sets respectively connected between the three-phase live lines U, V, and W at the AC side of the inverter and the input terminal of the switch unit 102.

Figure 8:
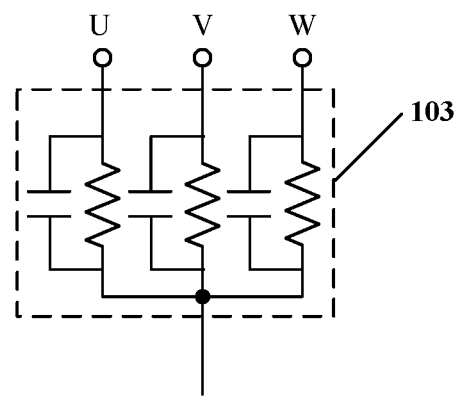
FIG. 8 is a schematic structural diagram of a discharge unit according to another embodiment of the present disclosure.

The passive component set includes a resistor and a capacitor connected in parallel, as shown in FIG. 8. It is to be noted that, the passive component set illustrated in FIG. 8 is only an example. The passive component set is not limited to the configuration illustrated in FIG. 8, but can be implemented according to actual application conditions. The present disclosure is not limited to the above described passive component set, and all the possible implementations are within the scope of the present disclosure.

Preferably, the switch unit 102 includes a switch, a relay, or a semi-conductive switch element.

In practices, the discharge unit 103 may have any configurations including a combination of a resistor, an inductor or other passive components, which is not limited herein. The switch unit 102 includes at least one controlled switch component (a switch, a relay, or a semi-conductive switch element) for connection or disconnection with ground or the reference ground. The controlled switch component may be a single switch component or a combination with other components, which is not limited herein.

On the basis of the above embodiments, both the discharge unit 103 and the switch unit 102 can be implemented according to actual application conditions, and is not limited herein. Any possible implementations are within the scope of the present disclosure.

Figure 9:
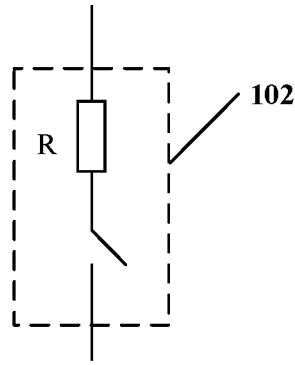
FIG. 9 is a schematic structural diagram of a switch unit according to an embodiment of the present disclosure.

A device for suppressing a common-mode voltage of an inverter AC cable relative to ground is provided according to another embodiment of the present disclosure. Referring to FIG. 9, on the basis of the devices according to the above embodiments and illustrated in FIGS. 3 to 8, the switch unit 102 further includes a resister R. One terminal of the resistor R serves as the input terminal of the switch unit 102, and the other terminal of the resistor R is connected with the switch, the relay or the semi-conductive element.

The stress on the switch component can be decreased due to the additional resistor R in the switch unit 102, such that the device for suppressing a common-mode voltage of an inverter AC cable relative to ground is more reliable and the service lift thereof is extended.

In practices, other components than the resistors can be adopted for decreasing the stress on the switch components in the switch unit 102. The resistor R is only an example, and is not intended to be limiting. The components for decreasing the stress on the switch components in the switch unit 102 can be implemented according to actual application conditions, and any possible implementations are within the scope of the present disclosure.

Figure 10:
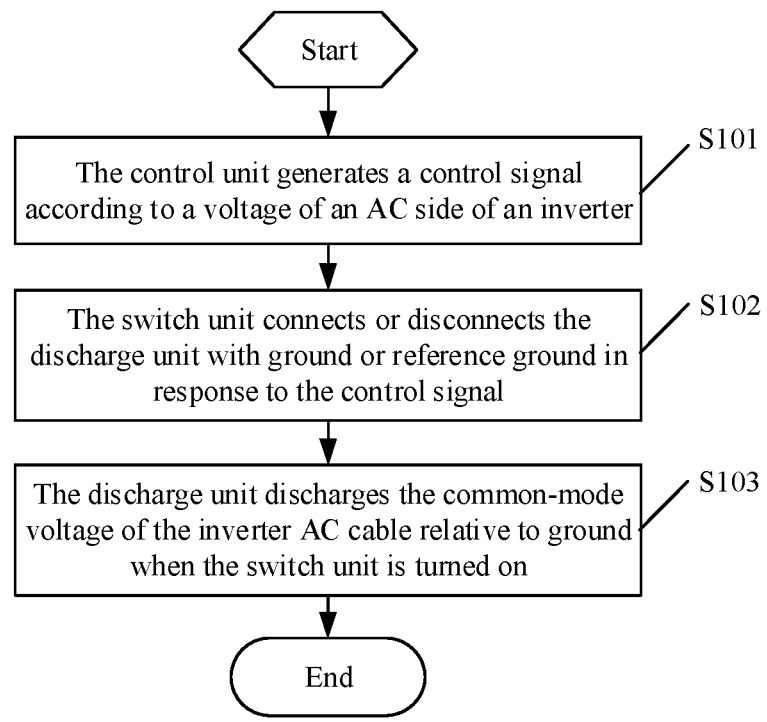
FIG. 10 is a flow chart of a method for suppressing a common-mode voltage of an inverter AC cable relative to ground according to an embodiment of the present disclosure.

A method for suppressing a common-mode voltage of an inverter AC cable relative to ground is provided according to another embodiment of the present disclosure. The method is applicable to a device for suppressing a common-mode voltage of an inverter AC cable relative to ground, including a control unit, a switch unit and a discharge unit. As shown in FIG. 10, the method for suppressing a common-mode voltage of an inverter AC cable relative to ground includes the following steps S101 to S103.

In step S101, the control unit generates a control signal according to a voltage of an AC side of an inverter.

In step S102, the switch unit connects or disconnects the discharge unit with ground or reference ground in response to the control signal.

In step S103, the discharge unit discharges the common-mode voltage of the inverter AC cable relative to ground when the switch unit is turned on.

With the method for suppressing a common-mode voltage of an inverter AC cable relative to ground, during maintenance of the inverter when the AC switch is turned off, the common-mode voltage of the AC cable relative to ground can be discharged without using the isolated sampling solution in the conventional technology which has a high implementation cost and has a high requirement on the insulation class of the components, thereby avoiding the risk of electric shock to the maintenance technician.

Preferably, step S101 may be performed as follows.

The control unit determines whether the AC side of the inverter is connected with a power grid according to the voltage of the AC side of the inverter.

The control unit generates a control signal for controlling the switch unit to be turned off in a case that the AC side of the inverter is connected with the power grid.

The control unit generates a control signal for controlling the switch unit to be turned on in a case that the AC side of the inverter is disconnected with the power grid.

Alternatively, the switch unit includes a normally closed relay, and step S101 is performed as follows.

The control unit generates, according to the voltage of the AC side of the inverter, a power-supply voltage of the normally closed relay as a control signal for controlling the normally closed relay to be opened in a case that the AC side of the inverter is connected with a power grid, and generates, according to the voltage of the AC side of the inverter, a voltage lower than the power-supply voltage as a control signal for controlling the normally closed relay to be closed in a case that the AC side of the inverter is disconnected with the power grid.

The working principles are the same as the above embodiments, and are not repeated.

In the present specification, the embodiments are described in progressive manner. Each embodiment mainly focuses on an aspect different from other embodiments, and reference can be made to these similar parts among the embodiments. The device disclosed in the embodiment corresponds to the method disclosed in the embodiment, and is described relatively simply. For detailed description of the device, reference may be made to the related description of the method.

What is described above is only preferred embodiments of the present disclosure and is not intended to limit the present disclosure in any way. The preferred embodiments of the present disclosure are disclosed above, which should not be interpreted as limiting the present disclosure. Numerous alternations, modifications, and equivalents can be made to the technical solutions of the present disclosure by those skilled in the art in light of the methods and technical content disclosed herein without deviation from the scope of the present disclosure. Therefore, any alternations, modifications, and equivalents made to the embodiments above according to the technical essential of the present disclosure without deviation from the scope of the present disclosure should fall within the scope of protection of the present disclosure.

The invention claimed is:

1. A device for suppressing a common-mode voltage of an inverter alternating current (AC) cable relative to ground, comprising:
   a control unit,
   a switch unit, and
   a discharge unit, wherein
   an output terminal of the control unit is connected with an input terminal of the switch unit, the control unit is configured to generate a control signal according to a voltage of an AC side of an inverter;
   a terminal of the switch unit is connected with an output terminal of the discharge unit and an N line at the AC side of the inverter, the other terminal of the switch unit is connected with ground or reference ground, the switch unit is configured to be turned off or turned on in response to the control signal; and
   input terminals of the discharge unit is connected with three-phase live lines at the AC side of the inverter, the discharge unit is configured to discharge the common-mode voltage of the inverter AC cable relative to ground when the switch unit is turned on.

2. The device for suppressing a common-mode voltage of an inverter AC cable relative to ground according to claim 1, wherein
   an input terminal of the control unit is connected with an AC side non-isolated sampling network at the AC side of the inverter, and
   the control unit is configured to determine whether the AC side of the inverter is connected with a power grid according to the voltage of the AC side of the inverter, generate a control signal for controlling the switch unit to be turned off in a case that the AC side of the inverter is connected with the power grid, and generate a control signal for controlling the switch unit to be turned on in a case that the AC side of the inverter is disconnected with the power grid.

3. The device for suppressing a common-mode voltage of an inverter AC cable relative to ground according to claim 1, wherein
   the switch unit comprises a normally closed relay;
   input terminals of the control unit are connected with the three-phase live lines at the AC side of the inverter; and
   the control unit is configured to generate, according to the voltage of the AC side of the inverter, a power-supply voltage of the normally closed relay as a control signal for controlling the normally closed relay to be opened in a case that the AC side of the inverter is connected with a power grid, and generate, according to the voltage of the AC side of the inverter, a voltage lower than the power-supply voltage as a control signal for controlling the normally closed relay to be closed in a case that the AC side of the inverter is disconnected with the power grid.

4. The device for suppressing a common-mode voltage of an inverter AC cable relative to ground according to claim 3, wherein
   the switch unit comprises a normally closed AC relay, and the control unit comprises an AC power supply circuit; or
   the switch unit comprises a normally closed direct current (DC) relay, and the control unit comprises an AC rectification circuit and a DC power supply circuit, input terminals the AC rectification circuit serving as the input terminals of the control unit, an output terminal of the AC rectification circuit being connected with an input terminal of the DC power supply circuit, and an output terminal of the DC power supply circuit serving as the output terminal of the control unit.

5. The device for suppressing a common-mode voltage of an inverter AC cable relative to ground according to claim 1, wherein the discharge unit comprises:
   resisters respectively connected between the three-phase live lines at the AC side of the inverter and the input terminal of the switch unit;
   inductors respectively connected between the three-phase live lines at the AC side of the inverter and the input terminal of the switch unit; or
   passive component sets respectively connected between the three-phase live lines at the AC side of the inverter and the input terminal of the switch unit.

6. The device for suppressing a common-mode voltage of an inverter AC cable relative to ground according to claim 1, wherein the switch unit comprises at least one controlled on-off component comprising a switch, a relay, or a semi-conductive switch element.

7. The device for suppressing a common-mode voltage of an inverter AC cable relative to ground according to claim 6, wherein the switch unit further comprises a resister, one terminal of the resistor serves as the input terminal of the switch unit, and the other terminal of the resistor is connected with the switch, the relay or the semi-conductive element.

8. A method for suppressing a common-mode voltage of an inverter alternating current (AC) cable relative to ground, applied to a device for suppressing a common-mode voltage of an inverter AC cable relative to ground comprising a control unit, a switch unit and a discharge unit, the method for suppressing a common-mode voltage of an inverter AC cable relative to ground comprising:
   generating, by the control unit, a control signal according to a voltage of an AC side of an inverter;
   connecting or disconnecting, by the switch unit, the discharge unit with ground or reference ground in response to the control signal; and
   discharging, by the discharge unit, the common-mode voltage of the inverter AC cable relative to ground when the switch unit is turned on.

9. The method for suppressing a common-mode voltage of an inverter AC cable relative to ground according to claim 8, wherein the generating, by the control unit, the control signal according to the voltage of the AC side of the inverter comprises:
   determining, by the control unit according to the voltage of the AC side of the inverter, whether the AC side of the inverter is connected with a power grid;
   generating, by the control unit, a control signal for controlling the switch unit to be turned off in a case that the AC side of the inverter is connected with the power grid; and
   generating, by the control unit, a control signal for controlling the switch unit to be turned on in a case that the AC side of the inverter is disconnected with the power grid.

10. The method for suppressing a common-mode voltage of an inverter AC cable relative to ground according to claim 8, wherein the switch unit comprises a normally closed relay; and the generating, by the control unit, the control signal according to the voltage of the AC side of the inverter comprises:
- generating, by the control unit according to the voltage of the AC side of the inverter, a power-supply voltage of the normally closed relay as a control signal for controlling the normally closed relay to be opened in a case that the AC side of the inverter is connected with a power grid; and
- generating, by the control unit according to the voltage of the AC side of the inverter, a voltage lower than the power-supply voltage as a control signal for controlling the normally closed relay to be closed in a case that the AC side of the inverter is disconnected with the power grid.

\* \* \* \* \*